United States Patent [19]

Nakajima et al.

[11] Patent Number: 5,420,663
[45] Date of Patent: May 30, 1995

[54] APPARATUS FOR EXPOSING PERIPHERAL PORTION OF SUBSTRATE

[75] Inventors: Masao Nakajima, Yokohama; Masayoshi Naito, Sendai, both of Japan

[73] Assignee: Nikon Corporation, Tokyo, Japan

[21] Appl. No.: 210,275

[22] Filed: Mar. 18, 1994

[30] Foreign Application Priority Data

Mar. 19, 1993 [JP] Japan ................... 5-060419
Mar. 19, 1993 [JP] Japan ................... 5-060421

[51] Int. Cl.[6] .................. G03B 27/48; G03B 27/50
[52] U.S. Cl. ...................... 355/50; 355/53; 355/77; 356/375
[58] Field of Search ............ 355/50, 53, 77; 356/375

[56] References Cited

U.S. PATENT DOCUMENTS

| | | | |
|---|---|---|---|
| 4,887,904 | 12/1989 | Nakazato et al. | 356/375 |
| 4,899,195 | 2/1990 | Gotoh | 355/77 |
| 4,910,549 | 3/1990 | Sugita | 355/53 |
| 5,028,955 | 7/1991 | Hayashida et al. | 355/53 |
| 5,168,021 | 12/1992 | Arai et al. | 430/22 |
| 5,168,304 | 12/1992 | Hattori | 355/48 |
| 5,229,811 | 7/1993 | Hattori et al. | 355/50 |
| 5,289,263 | 2/1994 | Kiyokawa et al. | 356/375 |
| 5,361,121 | 11/1994 | Hattori et al. | 355/50 |

FOREIGN PATENT DOCUMENTS

0461932A2 12/1991 European Pat. Off. .

*Primary Examiner*—Richard A. Wintercorn
*Attorney, Agent, or Firm*—Shapiro and Shapiro

[57] ABSTRACT

An exposure apparatus for exposing a peripheral portion of a substrate to light comprises a rotating member for rotating a substrate to which a resist is applied, an irradiating system for irradiating the substrate with light which is sensed by the resist, a position detecting system for detecting a relative position between the light and the substrate in a radial direction of the substrate, a moving system for making a relative movement between the light and the substrate in the radial direction of the substrate, a periphery detecting member for detecting outer-periphery information corresponding to a shape of an outer periphery of the substrate, a control system for servo-controlling the moving system in accordance with the outer periphery of the substrate to make the width of the light emitted on the substrate constant, a characteristic detecting member for detecting a specific part of the peripheral portion of the substrate, and a control characteristic changing member for changing a control quantity of the control system at the specific part of the peripheral portion of the substrate.

12 Claims, 10 Drawing Sheets

APPARATUS FOR EXPOSING PERIPHERAL PORTION OF SUBSTRATE

BACKGROUND OF THE INVENTION

1. Field of the Invention

The present invention relates to an exposure apparatus for exposing the peripheral portion of a substrate particularly of a semiconductor wafer or the like.

2. Related Background Art

In the manufacture of a semiconductor wafer, the peripheral portion of a substrate is sometimes exposed at a predetermined width (in the order of 1 to 7 mm, for example) to light so as to prevent the resist from peeling off the peripheral portion of substrate. As disclosed in U.S. Pat. No. 5,168,304 and EP 461932A2, an exposure apparatus of this type is known which comprises an irradiating portion for emitting a bundle of exposure light onto the peripheral portion of a substrate, and means for controlling an exposure light width by moving the irradiating portion radially of the substrate as the substrate rotates so as to make the exposure light width on the peripheral portion of the substrate agree with a predetermined value.

In this exposure apparatus, the exposure light is relatively moved with said substrate around the overall substrate by following the outer periphery of the substrate. When, therefore, orientation flat (hereinafter referred to as the "OF") is provided on the substrate, the irradiating portion also follows the OF to maintain a constant exposure light width. The OF is made up of a cut portion for setting the substrate in position. In place of the OF, a notch having a depth of 1 mm or so or cutouts may be formed in the peripheral portion of the substrate. The irradiating portion also follows the notch or the cutouts. Since the notch and the cutouts are much smaller than the OF, it is less necessary for the irradiating portion to follow the notch or the cutouts. When the irradiating portion follows the notch or the cutouts, the light exposed regions of the peripheral portion of the substrate shift toward the center of the substrate, and this causes a problem that the effective area of the substrate (the area of the region which can form a pattern, for example) is reduced.

Further, when a deviation (a change of the shape of the outer periphery of a substrate) increases rapidly, the irradiating portion responses excessively to the deviation at the lost portion in the periphery of the wafer (i.e., the notch or the cutouts). Thus, hunting or the like is generated in the control system to render the control system unstable, thereby producing variations in light exposure widths.

SUMMARY OF THE INVENTION

An object of the present invention is to provide an exposure apparatus for exposing a peripheral portion of a substrate in which the relative positions between an exposure light bundle and the peripheral portion of the substrate can be controlled so as to maintain the exposure light width to a predetermined value at the required portions.

Another object of the present invention is to provide an exposure apparatus for exposing a peripheral portion of a substrate stably and accurately to light even when the substrate has a discontinuous outer periphery.

In order to achieve these objects, an exposure apparatus for exposing a peripheral portion of a substrate on which a resist is applied according to the present invention, comprises:

a rotating member for rotating the substrate;

an irradiating system for irradiating the substrate with light which is sensed by the resist;

a position detecting system for detecting a relative position between the light and the substrate in a radial direction of the substrate;

a moving system for making relative movement between the light and the substrate in the radial direction of the substrate;

a periphery detecting means for detecting outer-peripheral information corresponding to a shape of an outer periphery of the substrate;

a control system for servo-controlling the moving system in accordance with the outer periphery of the substrate to keep the width of the light emitted on the substrate constant;

a characteristic detecting means for detecting a specific part of the peripheral portion of the substrate; and a control characteristic changing means for changing a control quantity of the control system at the specific part of the peripheral portion of the substrate,

DETAILED DESCRIPTION OF THE PREFERRED EMBODIMENTS

A first embodiment according to the present invention will be described with reference to the accompanying drawings.

Figure 1:
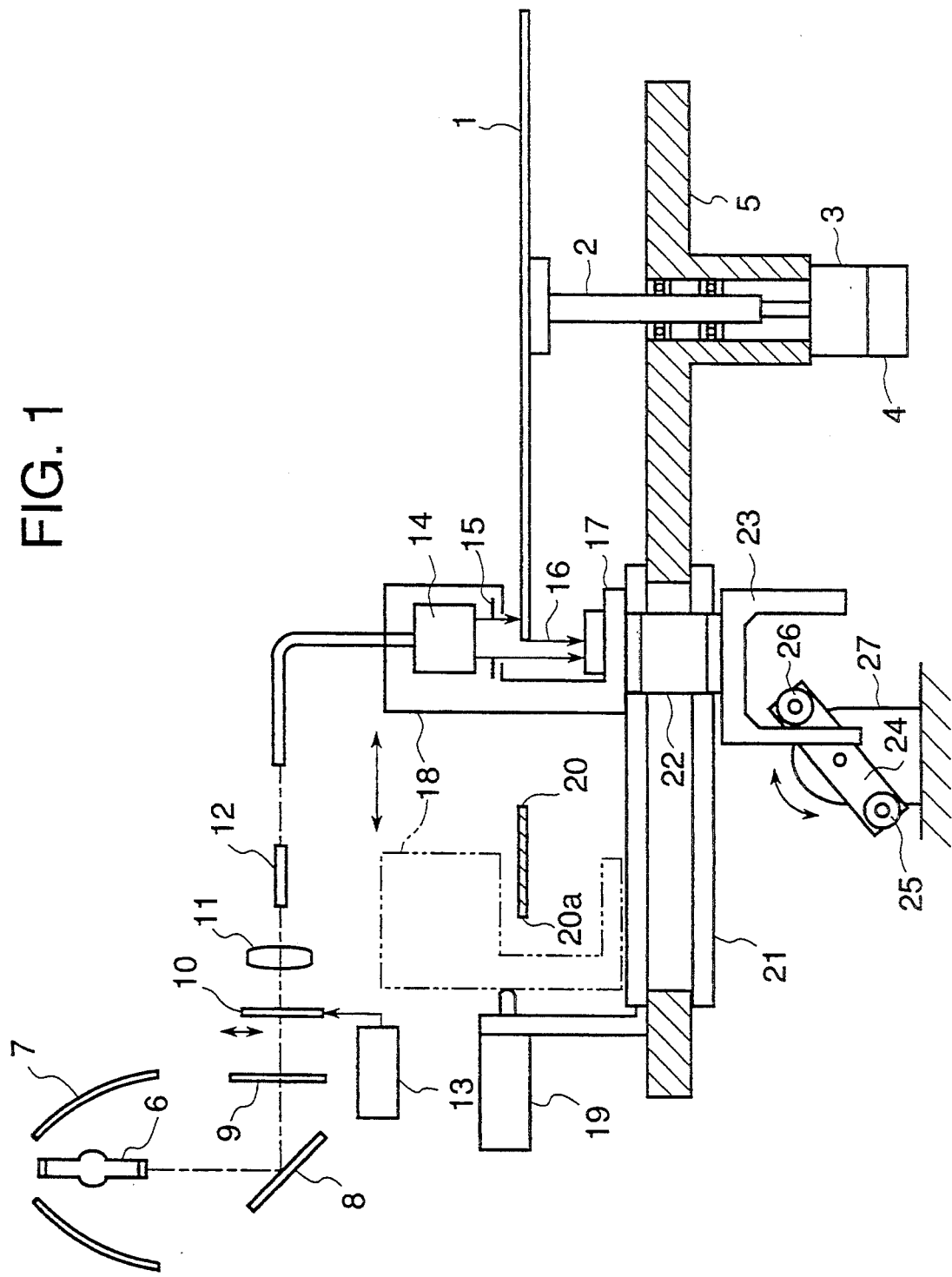
FIG. 1 is a general view of an exposure apparatus according to an embodiment of the present invention.

FIG. 1 shows a general structure of an exposure apparatus according to the first embodiment.

A turn table 2 (hereinafter referred to as the "table 2") adsorbs and holds a wafer 1 to be exposed. A motor 3 rotates the table 2 to revolve the wafer 1 in a plane substantially perpendicular to the rotary shaft of the motor 3. A rotational position detector 4, which is constituted by a rotary encoder, for example, outputs a signal corresponding to the rotational position of the motor 3. A base 5 rotatably supports the table 2.

Illuminating light from a light source 6 using an ultra-high voltage mercury lamp or the like enters a lens 11 through an elliptical mirror 7, a plane mirror 8, a shutter 9 and a wavelength selective filter 10.

The lens 11 collects the illuminating light from the light source 6 at the entrance end of an optical fiber 12. The illuminating light collected on the entrance end of the optical fiber 12 is guided by the optical fiber 12 to an illuminating portion 14.

A drive portion 13 is used to insert the wavelength selecting filter 10 into the optical path and retracts the same from the optical path. When the filter 10 is inserted into the optical path, a wavelength range of the illuminating light which responses sensitively to the resist on a wafer 1 is cut. The light bundle of this wavelength area cut by the filter 10 is hereinafter referred to as the "exposure light bundle", and the light bundle which does not include the exposure light bundle is hereinafter referred to as the "non-exposure light bundle".

A stop 15 forms an illuminating light 16 from the light irradiating portion 14 into a required shape (a rectangular shape in this embodiment). A light receiving portion 17 receives the illuminating light 16 and supplies a signal corresponding to the condition of the light.

A holder 18 integrally holds the irradiating portion 14 and the light receiving portion 17. The holder 18 is movable together with a slider 22 on a linear guide 21 connected to the base 5.

As the holder 18 is moved toward the wafer 1, a part of the peripheral portion of the wafer 1 is placed between the irradiating part 14 and the light receiving portion 17. At the remotest position of the holder 18 from the wafer 1, a dummy wafer 20 can be inserted between the light illuminating portion 14 and the light receiving portion 17. When the holder 18 is disposed within a predetermined distance from the extreme left end in FIG. 1, a position detector 19 detects that the holder 18 is there.

Figure 3:
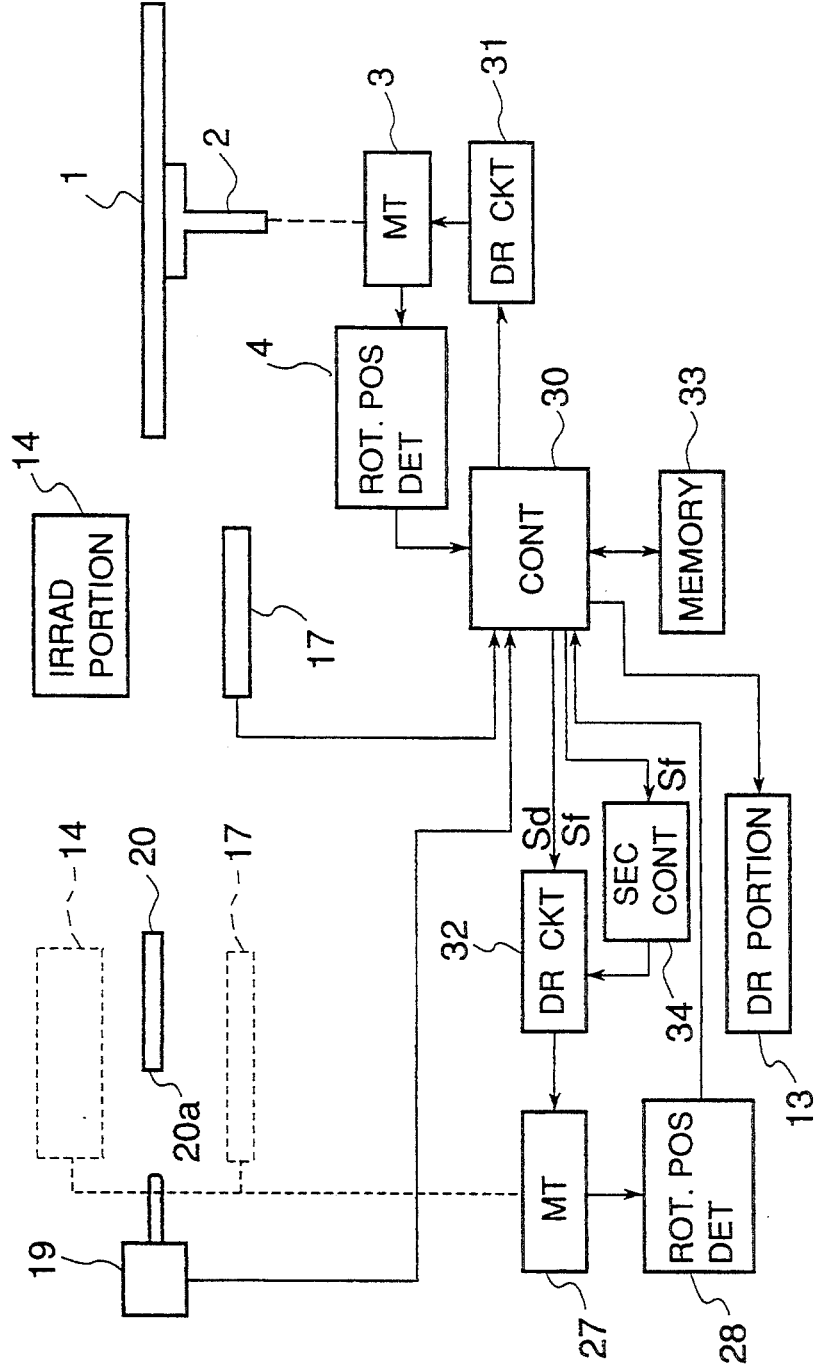
FIG. 3 is a block diagram of a control system of the apparatus shown in FIG. 1.

A movable block 23 fixed to the undersurface of the slider 22 (see FIG. 1) is always urged rightward by means of a spring (not shown) with the result that the movable block 23 abuts against either one of rollers 25 and 26 depending on the rotational position of a rotary arm 24. As the rotary arm 24 is rotated by means of a motor 27, the movable block 23 moves on the linear guide 21 in accordance with the rotational direction and the rotational angle and its position is changed. The rotational angle of the motor 27 is detected by a rotational position detector 28 such as a rotary encoder, as shown in FIG. 3.

Figure 2:
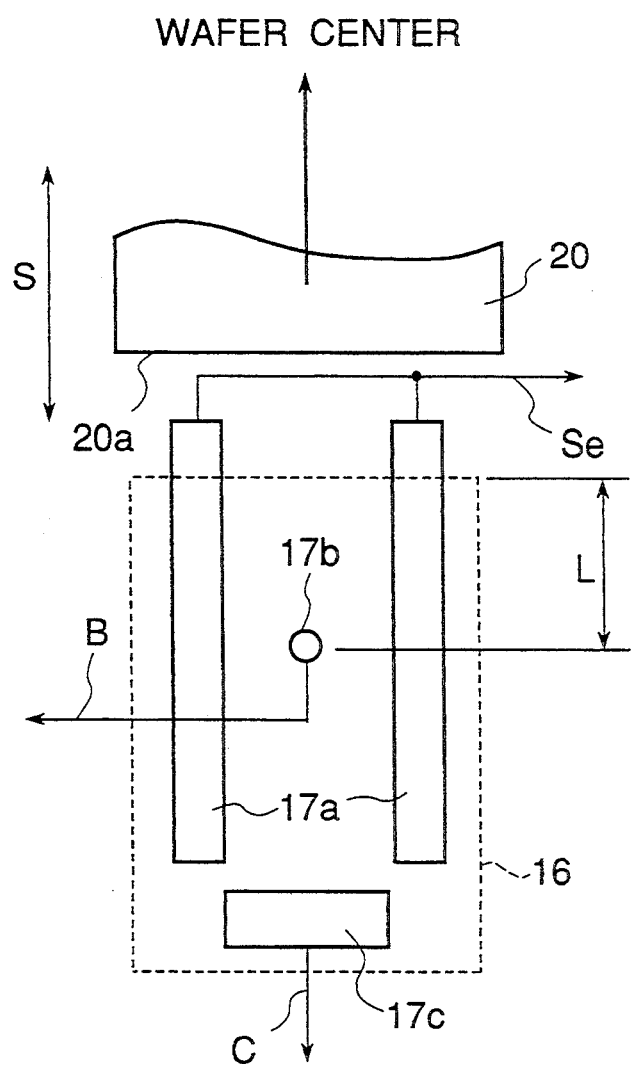
FIG. 2 is a detailed view of a light receiving portion of the apparatus shown in FIG. 1.

The structure of the light receiving portion 17 is shown in FIG. 2.

As shown in FIG. 2, the light receiving portion 17 comprises a pair of rectangular light receiving elements 17a extending in the moving directions S of the holder 18, a pin-hole shaped edge sensor 17b and a light receiving element 17c.

The light edge sensor 17b is separated from the edge of the illuminating light bundle 16 at the side of the wafer 1 by a predetermined distance L.

The light receiving element 17c is provided at the vicinity of the edge of the illuminating light bundle 16 at the opposite side of the wafer 1.

The light receiving element 17a covers a part of the peripheral portion of the wafer 1 or an edge portion 20a of the dummy wafer 20 depending on the movement of the holder 18, and outputs a signal Se corresponding to the quantity of the illuminating light 16 arriving at the light receiving portion 17 without being shielded by the peripheral portion of the wafer 1 or the edge 20a of the dummy wafer 20 (FIG. 1).

The edge sensor 17b outputs signals B whose levels are different as to whether or not it receives the illuminating light bundle 16. The light receiving element 17c receives the illuminating light bundle 16 at its overall surface irrespective of the position of the holder 18 and outputs a signal C corresponding to the intensity of the illuminating light bundle 16.

FIG. 3 shows a block diagram of the control system of the exposure apparatus according to this embodiment. A first control portion 30 supplies drive signals to drive circuits 31 and 32 to control the rotation of the motors 3 and 27.

Further, the first control portion 30 outputs a drive signal to control the operation of the filter 10. Signals, as control information, corresponding to the rotational positions of the motors 3 and 27 and output by the rotational position detectors 4 and 28, a signal corresponding to the rotational position of the holder 18 and output by the position detector 19 and a signal corresponding to the light receiving condition and output by the light receiving portion 17 are supplied to the first control portion 30.

As will be described later, the first control portion 30 performs various kinds of operation in response to these signals. These signals are memorized in external memories of the first control portion 30. Information on the kinds of wafers 1 and exposure conditions are given by an indicator (not shown). The information includes the diameters of wafers, the existence and non-existence of OFs, the shapes and dimensions of OFs if any, the quantity of exposure light on wafers 1, and the given exposure widths of the peripheral portion of a wafer.

A second control portion 34 for changing the gains of a control system 34 will be described. The drive circuit 32 drives the motor 27 so that the deviation signal Sf supplied by the control portion 30 becomes zero in such a manner that the target position of the holder 18 coincides with the current position of the holder 18 detected by the rotational angle detector 28. The servo gains of the drive circuit 32 for the deviation signals Sf are set in accordance with the servo-gain setting signals supplied from the second control portion 34. The methods of processing the deviation signals Sd and Sf will be described later.

Figure 4:
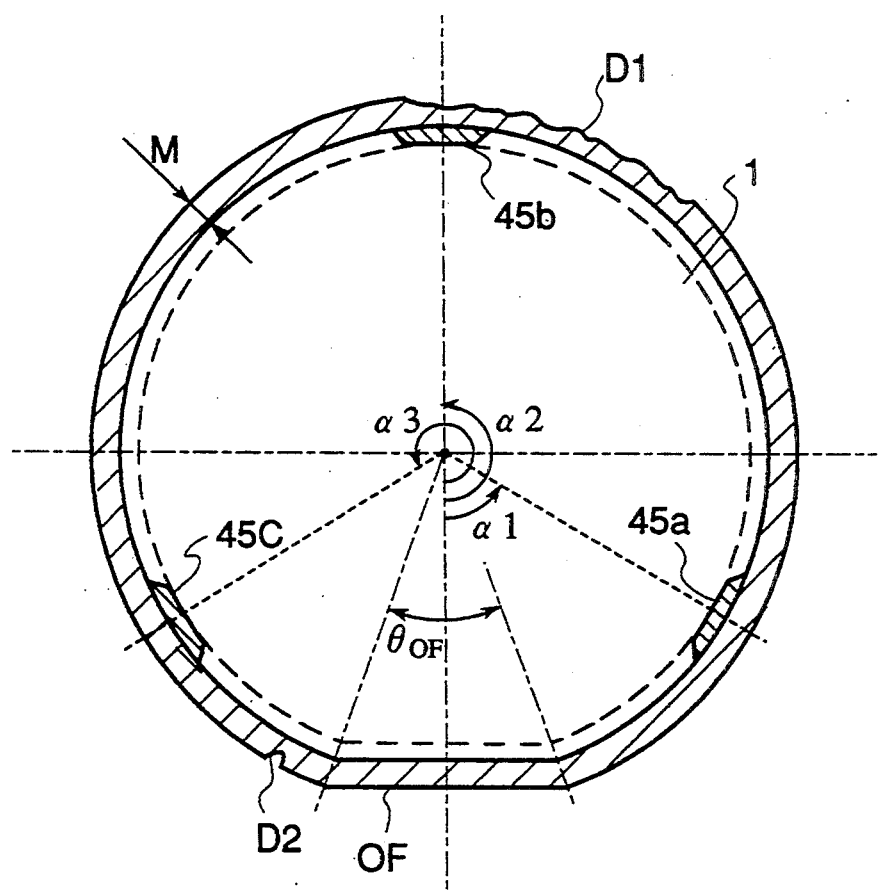
FIG. 4 is a plan view of an example of a wafer to which light is emitted by the apparatus shown in FIG. 1.

As shown in FIG. 4, a wafer 1 which has an OF and who se peripheral portion i s exposed at a predetermined width M. Specifically, the peripheral portion of the wafer 1 has a first irregular cutout D1 extending circumferentially and a substantially V-shaped notch D2.

Referring to FIGS. 5 to 8, the exposing method will be described.

According to the flow chart shown in FIG. 5, the operation of the control portion 30 will be described.

Figure 5:
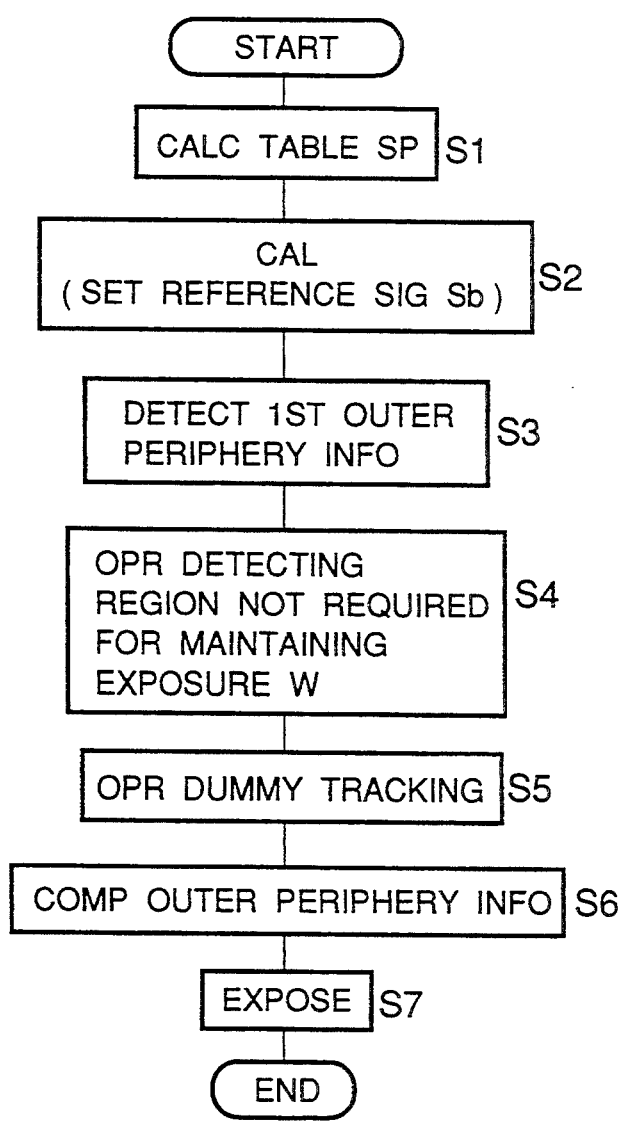
FIG. 5 is a flow chart showing the exposing steps according to a first embodiment of the present invention.

After a wafer 1 to be exposed has been mounted on the table 2 and the information on the kind and the exposure conditions of the wafer 1 has been input, the steps shown in FIG. 5 starts. In this case, predetermined gains are set by the second control portion 34.

In Step S1, the rotational speed is calculated based on the signal c supplied from the light receiving element 17c of the light receiving portion 17 so that the exposure is performed at the exposure light quantity suited for the resist of the wafer 1, and the calculated result is stored as speed information.

In Step S2, the calibration process is performed which calibrates the output signals of the light receiving portion 17 corresponding to the target exposure width M. In other words, the holder 18 is gradually moved to the edge 20a of the dummy wafer 20. When the edge 20a arrives at the edge sensor 17b, the level of the signal B changes. The position of the holder 18 where the level of the signal B changes is detected by the position detector 19.

Referring to FIG. 3, the holder 18 is moved toward or opposite to the wafer 1 by the difference between the target exposure width M and the length L. The value Se/C of the signal Se of the light receiving element 17a divided by the signal C of the light receiving element 17c is stored as a reference signal Sb.

The value of the signal Se divided by the signal C is used because the effect of the change of the signal Se due to the change of intensity of the illuminating light bundles 16 is excluded. For convenience, the value Se/C is hereinafter referred to as the "output signal".

In Step S3 is detected the first outer-periphery information corresponding to the peripheral shape of the wafer 1. The outer-periphery information is obtained in the following way. The holder 28 is fixed at the position where a part of the illuminating light bundle 16 overlaps with the peripheral portion of the wafer 1. The filter 10 is placed in the optical path of the illuminating light bundle 16 to make the illuminating light bundle 16 a non-exposure light bundle. During the rotation of the wafer 1 at a constant speed in these conditions, the change of the signal Se/C supplied from the light receiving portion 17 is detected. In this case, the signal Se/C supplied from the light receiving portion 17 changes in response to the eccentricity of the wafer 1 with respect to the center of the table 2 and the peripheral shape of the wafer 1. With the wafer 1 as shown in FIG. 4, for example, the signal Se/C gradually changes in accordance with the eccentricity of the wafer 1, but the light receiving quantities change abruptly and the signals Se/C are disturbed in the regions A1, A2 and A3 corresponding to the OF and the cutouts D1 and D2.

Figure 6:
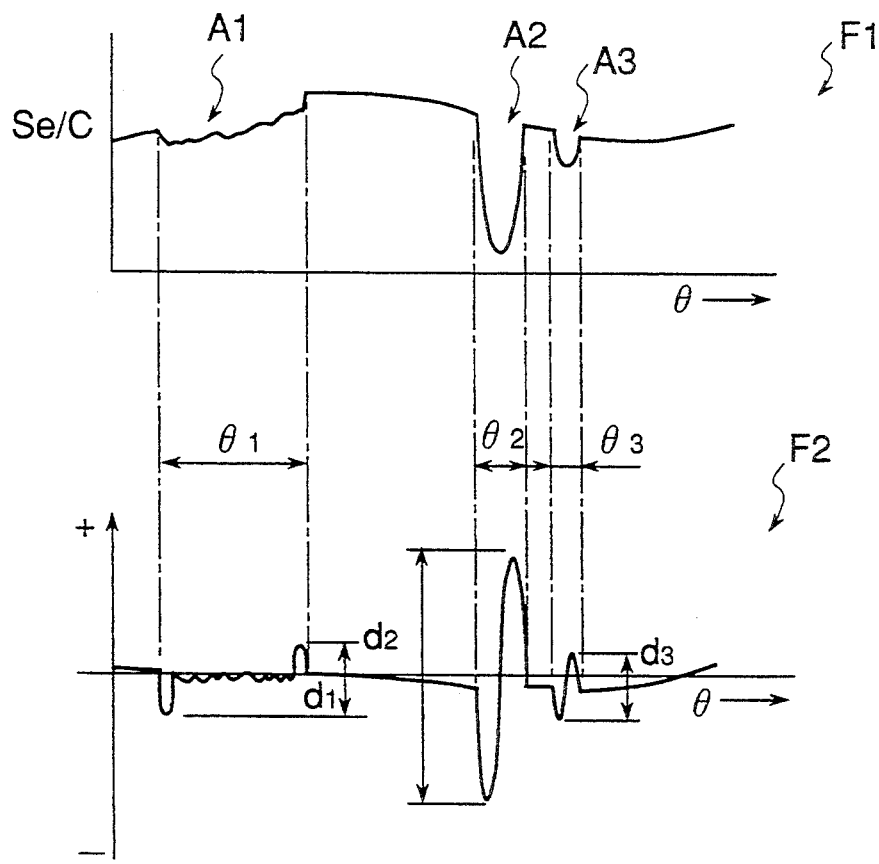
FIG. 6 is a chart showing information on a first outer peripheral shape.

The first outer-periphery information thus detected is stored in a memory 33. In FIG. 6, the section F1 shows the eccentricity of the wafer 1 and the signals Se/C (the first outer-periphery information) corresponding to the peripheral shape of the wafer 1, and the section F2 shows differentials of the waves of the signals Se/C.

In Step S4, the region not required for maintaining the exposure width of the peripheral portion of the wafer 1 is detected based on the first outer-periphery information detected in Step S3. The process carried out in Step S3 will be described with reference to FIGS. 6 and 8.

Figure 8:
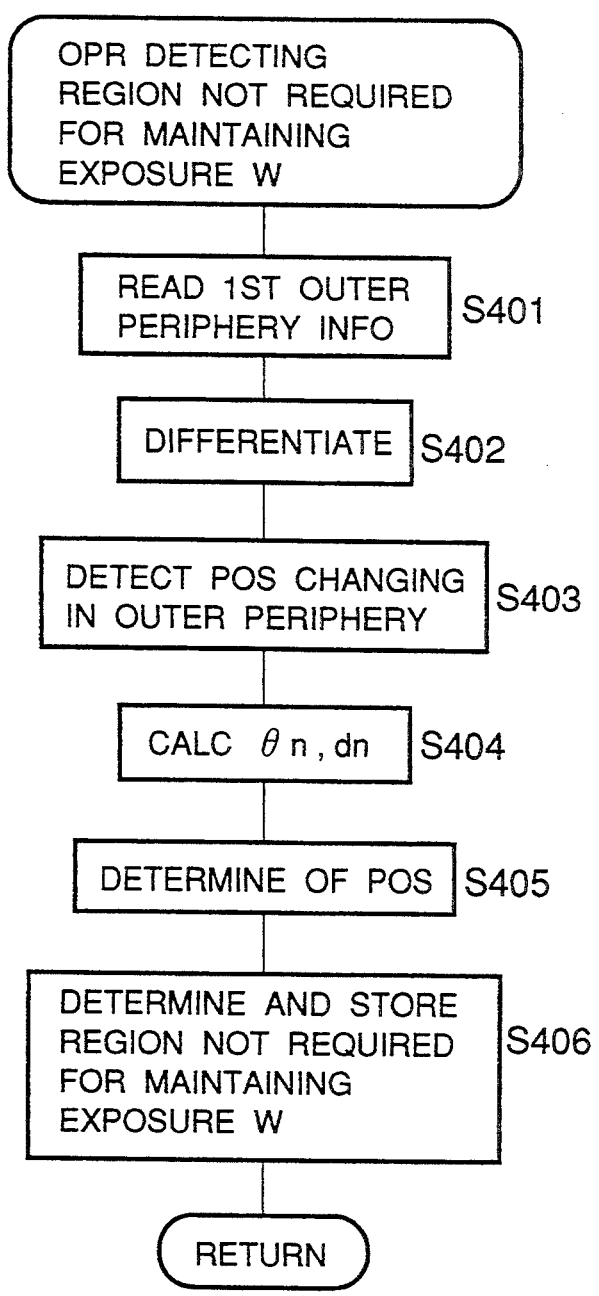
FIG. 8 is a flow chart showing the steps for processing the detection of the areas in which the width of the exposure light need not be maintained.

As shown in FIG. 8, the control portion 30 reads out the first outer-periphery information stored in the memory 33 in Step S401, and the first outer-periphery information is differentiated in Step S402 (see the section F2 in FIG. 6).

In the next step S403, the outer-periphery changed position is detected based on a wave obtained by differentiation. Since the eccentricity of the wafer 1 is generally small, the wave obtained by differentiating the outer-periphery information greatly changes positively or negatively at the portions of the periphery of the wafer 1 where its changes occur. The absolute values of the differentials of the signals Se/C are checked whether their values exceed a predetermined threshold. When the absolute value exceeds the threshold, it is decided that the position (region) where the absolute value exceeds the threshold is the outer-periphery changed position (region). In FIG. 6, all the absolute values of the differentials $d_1$, $d_2$ and $d_3$ exceed the threshold. Thus, the regions A1, A2 and A3 are the outer-periphery changed positions.

In Step S404, the outer-periphery change region An is discriminated based on the previously detected outer-periphery changed position, and the central angle $\theta n$ and the peak height dn of the differential value are obtained per region An.

In Step S405, the central angle $\theta_{OF}$ (see FIG. 4) and the peak height $d_{OF}$ of the OF previously given as information on the wafer 1 are calculated. The calculated result is compared with $\theta n$ and dn per outer-periphery change region obtained in Step S404 and then the position of the OF is specified.

In the example of differential wave shown in the section F2 in FIG. 6, the second region A2 counted from the start of the measurement is specified as the OF. The central angle $\theta_{OF}$ and the peak height $d_{OF}$ can be obtained in advance from the shape and dimension of the OF and the rotational speed of the table 2 at the time of detecting the first outer-periphery information (in Step S3 in FIG. 5).

In the next step S406, the regions An except for the region A specified as the OF are defined as the regions not required for maintaining the exposure width and their positions are stored. The position at which the differential value in the region A1 specified as the OF is defined as a central position. The positions of the regions A1 and A3 not required for maintaining the exposure widths can be expressed by the angles measured counterclockwise from the central position. In the section F2 in FIG. 6, the regions A1 and A3 correspond to the first cutout D1 and the second cutout D2, respectively. Step S5 starts after the regions not required for maintaining the exposure widths have been detected.

Although not shown in FIG. 4, the exposure apparatus may be provided with a pawl for holding the wafer 1. When the exposure widths of the abutting portions 45a to 45c of the wafer 1 which can abut against the pawl are set larger than the target exposure width M to allow the pawl to engage the respective abutting portions 45a to 45c, the angles $\alpha 1$ to $\alpha 3$ measured from the central position may be supplied as the information on the wafer 1 in advance, and then the positions of the abutting portions 45a to 45c may be indexed in accordance with this information and the position of the OF.

After detecting the regions not required for maintaining the exposure widths, dummy tracking is carried out in Step S5. In this process, the wafer 1 is rotated through at least one revolution with the filter 10 placed in the optical path of the illuminating light. As the wafer i is rotated, the position of the holder 18 is adjusted so that the difference Sd between the reference signal Sb (the signal Se/C corresponding to the target exposure width M) detected during the calibration in Step S2 and the current output signal Se/C supplied from the receiving portion 17 becomes zero. When the abutting portions 45a to 45c are provided, the differences Sd take predetermined values only at these portions.

During the dummy tracking, the radial positions of the holder 18 with respect to the wafer 1 are detected due to the output signals of the rotational positions, and the detected results are stored so as to correspond to the rotational positions of the wafer 1. Since the holder 18 moves radially of the wafer 1 by following the outer periphery of the wafer 1, the position data of the holder 18 stored in the memory 33 varies according to the shape of the periphery of the wafer 1. The position data is hereinafter referred to as the "second outer-periphery information".

Figure 7:
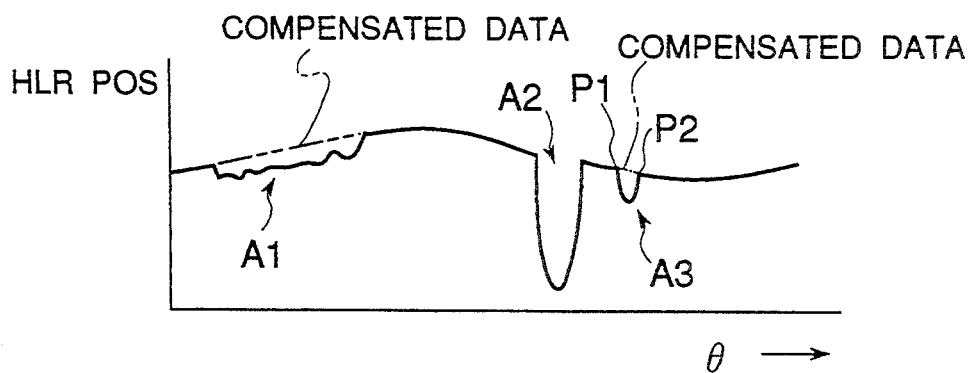
FIG. 7 is a chart showing information on a second outer peripheral shape.

After the dummy tracking, outer-periphery information compensation is performed in Step S6. As shown in FIG. 7, the exposure width adjusted regions An are obtained from the data in the form of a wave which is stored in the memory 33 due to the information on the exposure width adjusted regions An, and the wave form at these regions is compensated. The compensation reduces the control quantity of the position holder corresponding to the difference between the target exposure widths and the actual exposure widths. In the example shown in FIG. 7, the second outer-periphery information on the region A3 whose circumferential length on the wafer 1 is relatively short is compensated so that two points P1 and P2 on both sides of the region A3 are connected by a straight line. On the other hand, with regard to the region A1 whose circumferential length on the wafer 1 is relatively long, the original data of the region A1 are permuted by data of a curve of a second outer-periphery information of a case in which there is not the first cutout D1, which curve is obtained by calculating an eccentricity of the wafer 1 on the basis of the changes of the second outer-periphery information except for the information on the regions A1 to A3.

After the compensation of the second outer-periphery information, an exposure is carried out in Step S7. In the exposure process, the filter 10 is retracted from the optical path in such a manner that the illuminating-light bundle 16 is used as an exposure light bundle. As the table 2 is rotated at a speed obtained in Step S1, the position of the holder 18 is controlled to allow the second outer-periphery information stored in the memory 33 after the compensation to accord with the current position of the holder 18 detected by the rotational position detector 28. More specifically, the compensated second outer-periphery information is read out of the memory 33, and the deviation signals Sf corresponding to the differences between the read-out second outer-periphery information and the current positions of the holder 18 detected by the rotational position detector 28 are supplied to the drive circuit 32.

According to the above-mentioned processes, the holder 18 follows the second outer-periphery information so that the actual exposure widths are adjusted to the target expo sure widths.

In the regions A1 and A3 not required for maintaining the exposure widths, the second outer-periphery information is compensated to reduce the control quantity of the positions of the holder 18 corresponding to the differences between the target exposure widths and the actual exposure widths. At the first and second cutouts D1 and D2 taken as the regions A1 and A2 not required for maintaining the exposure widths, therefore, the holder 18 less follows the periphery of the wafer 1, rendering the actual exposure widths narrower than the target exposure widths. As a result, the disadvantageous reduction of the effective area of the wafer 1 is suppressed.

In this embodiment, the regions not required for maintaining the exposure widths are determined by the first outer-periphery information, and then they are compensated by the second outer-periphery information. Alternatively, the regions not required for maintaining the exposure widths are detected by the second outer-periphery information obtained by the dummy tracking to compensate the second outer-periphery information itself. When notches and/or cutouts are employed instead of the OFs, all portions, at which the absolute values of differentials of the outer-periphery information including information on the notches and/or cutouts exceed the predetermined thresholds, are preferably taken as regions not required for maintaining the exposure widths. Upon detecting the regions not required for maintaining the exposure widths, however, it is not always necessary to differentiate the outer-periphery information, but they may be specified by the wave form of the outer-periphery information. When the eccentricity of the wafer 1 is too large to specify the regions not required for maintaining the exposure widths by the first differentials, the eccentricity may be differentiated twice or more.

The exposure apparatus according to this embodiment controls the exposure widths by comparing the second outer-periphery information, obtained by the dummy tracking, with the current position of the holder 18. However, the present invention is not limited thereto but is applicable to an exposure apparatus which controls the positions of the holder 18 so as not to make constant the output signals supplied from the light receiving portion 17 and then executes the exposure. After the processes from the step for obtaining the first outer periphery information to the step for obtaining the regions not required for maintaining the exposure widths similar to those of this embodiment have been carried out, the control quantity of the positions of the holder in the regions not required for maintaining the exposure widths is determined by the information on the shape and dimension of the wafer 1 and the first outer-periphery information. When each region not required for maintaining the exposure width enters the illuminating light bundle at the time of the exposure, the position control of the holder 18 in response to the signal supplied from the light receiving portion 17 may be interrupted, and the positions of the holder 18 may be adjusted.

In order to reduce the control quantity of the positions of the holder 18 corresponding to the differences between the target exposure widths M and the actual exposure widths, the gains of the control system of the positions of the holder 18 are lowered only for the regions not required for maintaining the exposure widths, and the responsibility of the holder 18 to the changes of the outer-periphery of the wafer 1 may be lowered. The gains of the control system may be adjusted. More specifically, instead of compensating the outer-periphery information of the regions not required for maintaining the exposure widths, the servo gains for the deviation signals Sf may be lowered from the initial values by the use of the second control portion 34. In this case, the ends of the OF may be obtained in advance by the OF information, and the gains at its ends may be also lowered. The timing of the servo gain adjustment is set by the position information on the regions not required for maintaining the exposure widths (the rotational position information, for example). The adjustment quantity of the servo gains may be determined by the compensation of the outer-periphery information conducted in Step S6 or the information on the OF.

In this embodiment, prior to the exposure, the outer-periphery information of the substrate is detected and the regions required for maintaining the exposure width are determined. Upon the exposure, the control quantity of the relative positions between the exposure light bundle and the substrate corresponding to the differences between the target exposure widths and the actual exposure widths are reduced at the regions not required for maintaining the exposure widths. Thus, the relative positions between the exposure light bundle and the peripheral portion of the substrate is controlled so as to maintain the target exposure widths only at the necessary portions. Thus, the effective area of the wafer 1 is not reduced uselessly.

A second embodiment of the present invention will be described.

In the first embodiment, the regions not required for maintaining the exposure widths are obtained prior to the exposure. In the regions not required for maintaining the exposure widths, the outer-periphery information is complemented or the control of the positions of the holder 18 due to the signals supplied from the light receiving portion 17 is interrupted. In these ways, the exposure widths are regulated by adjusting the positions of the holder 18 by predetermined control quantities or by adjusting the gains of the control system. In other words, the control quantities of the positions of the holder 18 corresponding to the differences between the target exposure widths M and the actual exposure widths are reduced.

On the contrary, the second embodiment does not obtain any regions not required for maintaining the exposure widths in advance and exposes the peripheral portion of the substrate at stable exposure widths by regulating the gains of the control system in the unstable controlled areas of the wafer (the areas in which the periphery of the wafer change discontinuously).

Figure 9:
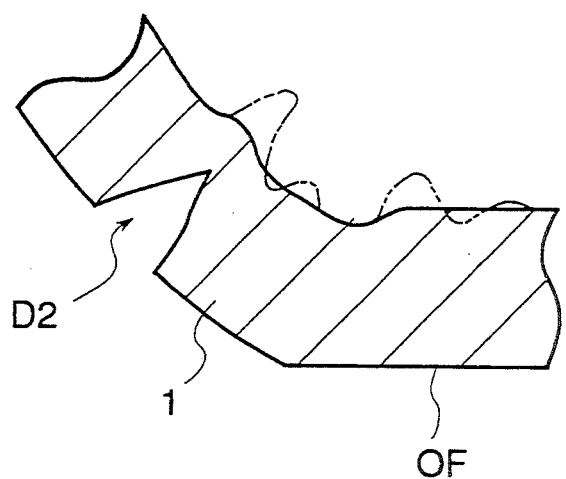
FIG. 9 is an enlarged view of a part of a wafer in the vicinity of an OF after light exposure.

In the above-mentioned peripheral exposure apparatus provided with the control system in which the light irradiating portion follows the changes of the outer-periphery of the substrate, the outer shape of the wafer abruptly changes at the notches and/or cutouts formed in the peripheral portion of the wafer. The light irradiating portion excessively responds to the changes and the control system becomes unstable due to hunting or the like, thereby producing variations in the exposure widths. FIG. 9 generally illustrates how the variations are generated at a cutout and an OF (where the outer-periphery of the wafer changes discontinuously). The method of regulating the gains of the control system according to the second embodiment facilitates an exposure at stable exposure widths even on a substrate having portions at which the outer-periphery changes discontinuously without complementing the outer-periphery information in advance.

In describing the second embodiment in detail with reference to the drawings, the same parts and members as those of the first embodiment are denoted by the same reference numerals and the differences from the first embodiment are mainly described.

The operation of the second control system 34 of the second embodiment will be described with reference to FIG. 3. As explained above, the drive circuit 32 drives the motor 27 to diminish the deviation signals Sd or Sf supplied from the control portion 30. The servo gains of the drive circuit 32 for the deviation signals Sf are set by the servo gain setting signals supplied by the second control portion 34. The method of processing the deviation signals Sd and S by the second control portion 34 will be described later.

The exposure in the second embodiment will be described with reference to FIGS. 10, 11 and 12. In this case, it is assumed that the peripheral portion of a wafer 1 which is to be exposed at a constant width M has an OF, as shown in FIGS. 4 and 9. It is also assumed that a generally V-shaped cutout $D_2$ is formed close to the OF in the peripheral portion of the wafer 1.

Figure 10:
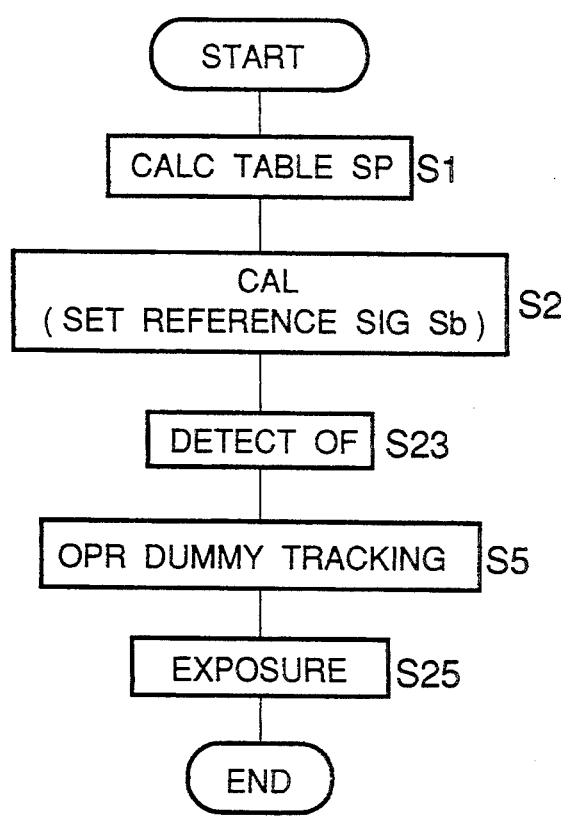
FIG. 10 is a flow chart showing the exposing steps of a second embodiment.

FIG. 10 shows a flow chart illustrating a series of processes (exposure in this embodiment) by means of the control portion 30. After a wafer 1 to be exposed has been sucked by the table 2 and information on the kind and the exposure conditions of the wafer 1 has been input, the processes shown in FIG. 10 commence.

Step S1 (the process for obtaining the table speed), Step S2 (calibration) and Step S5 (dummy tracking) in the flow chart in FIG. 10 are the same as those of the first embodiment described with reference to FIG. 5, the description of them being made simply.

In Step S1, the rotational speed of the motor is calculated due to the signal C from the light receiving element 17c of the light receiving portion 17 to expose the resist of the wafer 1 at a proper exposure quantity, and the calibrated result is stored as speed information.

In Step S2, the output signal of the light receiving portion 17 is set which corresponds to the target exposure width M.

In Step S23, the position of the OF is detected. In doing so, the holder 18 is fixed to the position at which a part of the illuminating light bundle 16 overlaps with the peripheral portion of the wafer 1. The filter 10 is inserted into the optical path of the illuminating light thereby making the illuminating light bundle 16 a non-exposure light bundle, and the changes of the signals Se/C supplied from the light receiving portion 17 are recorded by rotating the wafer 1 at a constant speed. The recorded wave form gradually changes as shown in the section F3 in FIG. 11 in response to the eccentricity of the wafer 1. However, the wave form changes abruptly as the quantity of the receiving light changes at the OF and the cutout $D_2$. In other words, the signals Se/C abruptly change at the regions An. Based on information on the shape and the dimension of the OF given in advance, it is known which region An corresponds to the OF. The central angle $\theta n$ of the region An or the deviation $\delta$ of the signal Se/C is used as discriminating information, for example. The discrimination may be made by a wave form of differentials of the signals Se/C.

The center of the region A2 identified as an OF is memorized as its central position in connection with the rotational position of the table 2. The memorized information is used to index the rotational position of the wafer 1 as is carried out later, for example.

When the exposure apparatus is provided with a pawl for holding the wafer and the exposure width of the abutting portions 45a to 45c of the wafer 1 which can abut with the pawl is set larger than the target exposure width M to allow the pawl to engage the respective abutting portions 45a to 45c, the angles $\alpha 1$ to $\alpha 3$ measured from the central position may be supplied as the information on the wafer 1 in advance, and then the positions of the abutting portions 45a to 45c may be indexed based on this information and the position of the OF.

In Step S5, the dummy tracking is performed. This process moves the holder 18 radially of the wafer to maintain the target exposure width M. The data on the position of the holder 18 stored in the memory 33 shows the target position of the holder 18 per rotational position of the wafer 1 necessary to maintains the exposure width to the target exposure width.

After the dummy tracking, an exposure is executed in Step S25. In the exposure, the illuminating light bundle 16 is made an exposure light bundle by retracting the filter 10 from the optical path, and the table 2 is rotated at a speed obtained in Step S1. The target position of the holder 18 is read out of the memory 33 in response to the rotational position of the table 2, and a deviation signal Sf corresponding to the difference between the target position and the current position of the holder is detected by the rotational position detector 28 is output to the drive circuit 32 and the second control portion 34. The drive circuit 32 drives the motor 27 to diminish the above-mentioned deviation signal Sf at the servo gain corresponding to the gain setting signal output from the second control portion 34. In this way, the holder 18 is moved to follow the outer periphery of the wafer 1, and the exposure width is maintained to the target exposure width M.

Figure 12:
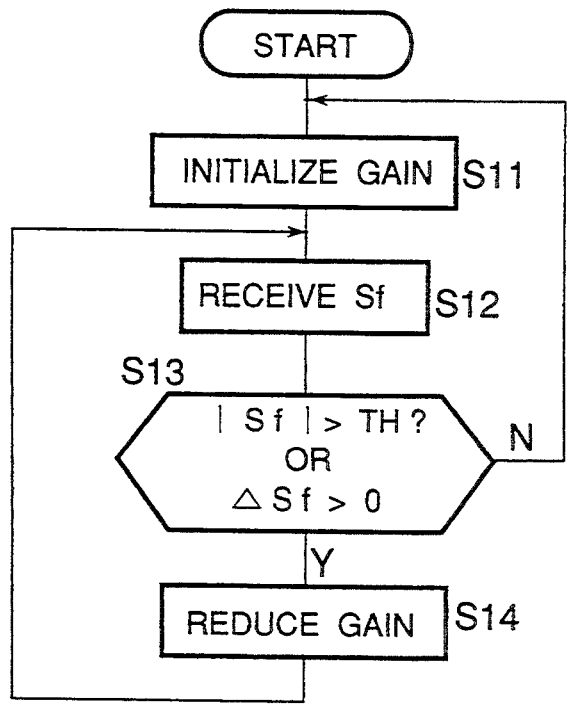
FIG. 12 is a flow chart showing the gain adjusting steps of the control system of the second embodiment.

FIG. 12 shows a flow chart illustrating the processes of the second control portion 34 during the exposure. When the deviation signal Sf is output from the control portion 30, the processes shown in FIG. 12 start. In Step S11, the servo gain is set to a predetermined initial value. The initial value is set relatively highly to improve a response characteristic of the holder 18.

In Step S12, the deviation signal Sf is supplied from the control portion 30. In Step S13, it is determined whether or not the absolute value of the deviation signal Sf is higher than the predetermined threshold TH and whether or not the difference ΔSf between the absolute value of the current deviation signal Sf and the absolute value of the previously input deviation signal Sf is larger than zero (in other words, it is determined whether or not the region concerned is an unstably controlled region). When both processes or either process is "yes" Step S14 is executed. When both processes in Step S13 are "no", the process returns to Step S11 to set the servo gain to the initial value. It is determined whether the difference between the target position and the current position of the holder 18 is divergent based on the fact whether or not ΔSf is larger than zero. Judgment as to whether or not the difference is divergent may be made not only from the difference between the absolute value of the current and previous deviation signal Sf but also by comparing the absolute values of three or more adjacent deviation signals Sf.

In Step S14, the servo gain corresponding to the current deviation signal Sf or ΔSf is calculated. The gain setting signal corresponding to the calculated result is output to the drive circuit 32, and the servo gain is made lower than the initial value set in Step S11. As the deviation signals Sf or ΔSf increase, the servo gains preferably are increased or decreased gradually.

Figure 11:
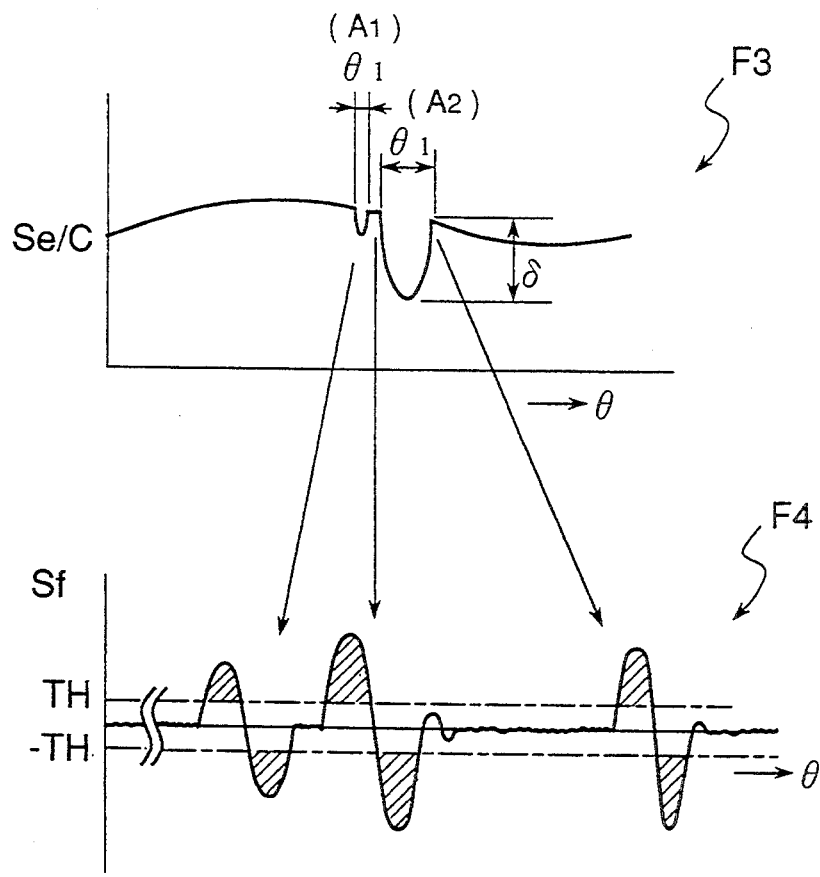
FIG. 11 is a diagram showing inputs and outputs of the control portion concerning the wafer of FIGS. 4 and 9.

The section F4 in FIG. 11 shows deviation signals Sf corresponding to the changes of the outer periphery of the substrate 1 as shown in the section F3 in FIG. 11. Since the positions of the outer periphery of the wafer 1 abruptly change at the OF and the cutout $D_2$ (FIGS. 4 and 9) as already described, the deviation signals Sf greatly change at both ends of the OF (the region A2) which has a longer circumferential length and in the whole area of the cutout $D_2$ (the region A2) which has a shorter circumferential length. When the second control portion 34 is processed in response to the deviation signals Sf of the part F4 in FIG. 11 is described above, the exposure light bundle comes to the ends of the cutout $D_2$ and the OF, and the absolute values of the deviation signals Sf exceed the threshold TH as hatched in the part F4 in FIG. 11. The servo gains of the drive circuit 32 are reduced, and the response of the holder 18 is lowered. The servo gains are also lowered when the absolute values of the deviation signals Sf increase.

As a result, the variation of the exposure width (the hatched width in FIG. 9) at the end of the OF rapidly diminishes. When high servo gains are maintained, the reduction of the variation of the exposure width at the ends of the OF is delayed.

The exposure light bundle does not follow the cutout $D_2$ but passes along the part of the outer periphery of the substrate 1 at both ends of the cutout $D_2$. Thus, the exposure width does not expand toward the center of the wafer 1, and the area of the region surrounded by the exposed peripheral portion of the wafer 1 increases. As a result, the yield of the chips is elevated. When, on the other hand, high servo gains are maintained at the cutout $D_2$, the holder 18 follows the cutout which is otherwise neglected and is moved radially of the wafer 1. Thus, the light exposed peripheral portion of substrate 1 extends toward the center of the wafer 1, reducing the yield of the chips.

When the exposure widths are changed at the abutting portions 45a to 45c in the exposure apparatus according to this embodiment, the data on the target positions of the holder 18 obtained in the dummy tracking are preferably compensated at the positions of the abutting portions 45a to 45c. In this case, the deviation signals Sf extend even at the ends of the abutting portions 45a to 45c, and the servo gains are changed by the second control portion 34. In consequence, the variations of the exposure widths diminish rapidly even at the abutting portions 45a to 45c.

In this embodiment, the exposure apparatus is described which controls the exposure signals Sf by the deviation signals Sf corresponding to the differences between the target positions 18 and the current positions of the holder 18 obtained in the dummy tracking. However, the present invention is not limited to this apparatus. When the dummy tracking is omitted and the exposure widths are changed by the deviation signals Sd corresponding to the differences between the deviation signals Sb obtained from the light receiving portion 17 in the calibration state and the output signals Se/C obtained from the light receiving portion 17 in the current state, the servo gains are preferably changed in response to the deviation signals Sd. Alternatively, the servo gains may be changed in response to the deviation signals Sd during the dummy tracking. Alternatively, the servo gains may be altered in response to the deviation signals Sd and Sf output from the control portion 30 not only during the dummy tracking but also during the exposure.

In both first and second embodiments, the relative rotational movement between the exposure light bundle and the substrate can be achieved by rotating the exposure light bundle around the substrate. Further, the relative movement to adjust an exposure width to the target exposure width M in the radial direction of the substrate may be attained by moving the substrate with respect to the exposure light bundle. The substrate is not necessarily circular but may be polygonal.

In these embodiments, the differences between the values of the actual and target relative positions between the light illuminating means and the substrate measured in the direction of the exposure width increase to reduce the servo gains in the regions in which the stability of the control system is lowered. In order to perform stable exposure on the peripheral portion of the substrate at a high accuracy, therefore, the inherent servo gains are set to a little high value to maintain the exposure widths at a high accuracy, and high stability of the control system is ensured in the regions in which the outer periphery and the exposure widths are changed discontinuously. At very small cutouts at which the exposure widths need not be set to the target values, the exposure light bundle is relatively moved with respect to the substrate, thereby preventing unnecessary expansion of the light exposed peripheral portion of the substrate.

What is claimed is:

1. An exposure apparatus for exposing a peripheral portion of a substrate on which a resist is applied, said apparatus comprising:
    a rotating member for rotating said substrate;
    a first irradiating system for irradiating said substrate with light which is sensed by said resist;
    a position detecting system for detecting a relative position between said light and said substrate in a radial direction of said substrate;
    a moving system for making relative movement between said light and said substrate in said radial direction of said substrate;
    a periphery detecting system for detecting outer-periphery information corresponding to a shape of an outer periphery of said substrate;
    a control system for servo-controlling said moving system in accordance with said outer periphery of said substrate to keep said width of said light emitted on said substrate constant;
    a characteristic detecting means for detecting a specific part of said peripheral portion of said substrate; and
    a control characteristic changing means for changing a control quantity of said control system at said specific part of said peripheral portion of said substrate.

2. An exposure apparatus according to claim 1, wherein said specific part comprises a notch or a cutout formed in said substrate.

3. An exposure apparatus according to claim 1, wherein said specific part comprises ends of a cut portion of said substrate.

4. An exposure apparatus according to claim 2, wherein said periphery detecting means memorizes said detected outer-periphery information, and said control characteristic changing means changes said control quantity of said control system in response to said outer-periphery information except for information on said specific part.

5. An exposure apparatus according to claim 4, wherein said control characteristic changing means changes said control quantity in response to said outer-periphery information at two adjacent positions on said specific part.

6. An exposure apparatus according to claim 1, wherein said control characteristic changing means lowers a gain of said control system at said specific part.

7. An exposure apparatus according to claim 6, wherein said periphery detecting means outputs a deviation signal corresponding to a deviation from a target value of said width, and said characteristic detecting means detects said specific part in response to said deviation signal.

8. An exposure apparatus according to claim 7, wherein said characteristic detecting means detects said specific part when said deviation signal exceeds a predetermined value.

9. An exposure apparatus according to claim 7, wherein said characteristic detecting means detects said specific part when said deviation signal is divergent.

10. An exposure apparatus according to claim 1, further comprising:
    a second irradiating system for emitting non-exposure light which is not sensed by said resist;
    a light receiving system confronting said second irradiating system, for receiving said non-exposure light; and
    said moving system making a relative movement between said non-exposure light and said substrate;
    a controlling and memorizing system for servo-controlling said moving system to irradiate said peripheral portion of said substrate at a predetermined width with said non-exposure light and for memorizing a relative position between said non-exposure light and said substrate; and
    wherein said control member controls said moving system in response to said memorized relative position upon exposure.

11. An exposure apparatus for exposing a peripheral portion of a substrate on which a resist is applied, said apparatus comprising:
    an irradiating system for irradiating a substrate to light which is sensed by the resist mounted on said substrate;
    a first moving system for moving said light along said substrate;
    a second moving system for making a relative movement between said light and said substrate to change an exposure width of a peripheral portion of said substrate;
    an output means for outputting a deviation signal corresponding to a deviation from a target value of a relative position between said irradiating system and said substrate;
    a first control system for controlling said second moving system to reduce said deviation signal to substantially zero;
    a detecting means for detecting wave form-information of said deviation signal; and
    a second control system for lowering a servo gain for said deviation signal in response to said wave form-information of said deviation signal.

12. A method of exposing a peripheral portion of a substrate to light, said method comprising:
    the step of irradiating a substrate to light which is sensed by a resist mounted on said substrate while said light is relatively moved with said substrate along an outer periphery of said substrate;
    the step of making a relative radial movement between said light and said substrate to adjust an exposure width to a predetermined value;
    the step of detecting a specific part of said peripheral portion of said substrate; and
    the step of adjusting a control quantity for said relative radial movement when said light is at said specific part.

* * * * *